(12) United States Patent
Romo et al.

(10) Patent No.: US 11,990,898 B2
(45) Date of Patent: May 21, 2024

(54) PARASITIC IMMUNE ISOLATED DRIVE

(71) Applicant: Hamilton Sundstrand Corporation, Charlotte, NC (US)

(72) Inventors: Francisco X. Romo, Rockford, IL (US); Christopher D. Thornton, St. Charles, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 81 days.

(21) Appl. No.: 17/679,016

(22) Filed: Feb. 23, 2022

(65) Prior Publication Data

US 2023/0268858 A1    Aug. 24, 2023

(51) Int. Cl.
| | |
|---|---|
| *H02M 3/156* | (2006.01) |
| *H02M 1/32* | (2007.01) |
| *H02M 3/155* | (2006.01) |
| *H02M 3/335* | (2006.01) |
| *H03K 17/691* | (2006.01) |

(52) U.S. Cl.
CPC ............ *H03K 17/691* (2013.01); *H02M 1/32* (2013.01); *H02M 3/155* (2013.01); *H02M 3/33546* (2013.01)

(58) Field of Classification Search
CPC ....... H02M 1/32; H02M 1/08; H02M 3/33546
See application file for complete search history.

(56) References Cited

U.S. PATENT DOCUMENTS

| | | | |
|---|---|---|---|
| 5,615,091 A | 3/1997 | Palatnik | |
| 6,587,358 B1 | 7/2003 | Yasumura | |
| 7,965,522 B1* | 6/2011 | Hornberger | H02M 1/08 363/21.1 |
| 9,369,053 B2 | 6/2016 | Ogasawara et al. | |
| 9,871,479 B2 | 1/2018 | Joyce et al. | |
| 10,027,267 B2 | 7/2018 | Vandergrift | |
| 10,574,147 B2* | 2/2020 | King | H02M 1/088 |
| 2005/0001582 A1 | 1/2005 | Goto et al. | |
| 2010/0067276 A1 | 3/2010 | Jansen et al. | |

(Continued)

FOREIGN PATENT DOCUMENTS

| | | | |
|---|---|---|---|
| CN | 203661377 U | * | 6/2014 |
| CN | 104602390 A | * | 5/2015 |

(Continued)

OTHER PUBLICATIONS

Extended European Search Report issued by the European Patent Office, dated Jun. 22, 2023, in corresponding European Patent Application No. 23158036.6.

*Primary Examiner* — Sisay G Tiku (57) ABSTRACT

In accordance with at least one aspect of this disclosure, an isolated drive (e.g., for a generator controller) includes a gate driver configured to operatively connect to a switch to drive the switch between a first state and a second state, a transformer configured to power the gate driver and provide an ON/OFF signal to the gate driver, an input line configured to connect a first side of the transformer to the gate driver, and a floating return line configured to connect a second side of the transformer directly to a source terminal of the switch such that parasitic currents from the transformer and/or drive circuit bypasses the gate driver and flows to the floating return line.

16 Claims, 4 Drawing Sheets

(56) References Cited

U.S. PATENT DOCUMENTS

| | | | | |
|---|---|---|---|---|
| 2015/0042403 A1* | 2/2015 | Laturell | ................ | H03F 3/2171 |
| | | | | 330/251 |
| 2017/0331471 A1* | 11/2017 | Yuzurihara | .............. | H03K 7/08 |
| 2020/0099376 A1* | 3/2020 | Rinne | ................ | H03K 17/6877 |
| 2021/0152173 A1* | 5/2021 | Yee | ......................... | H01F 27/24 |
| 2023/0258205 A1* | 8/2023 | Romo | .................. | F15B 21/087 |
| | | | | 60/459 |

FOREIGN PATENT DOCUMENTS

| | | | | |
|---|---|---|---|---|
| CN | 112994470 A * | 6/2021 | ............ | H02M 3/335 |
| CN | 113315495 A * | 8/2021 | | |
| CN | 113938116 A | 1/2022 | | |
| JP | 5556584 B2 | 7/2014 | | |
| WO | WO-2018142631 A1 * | 8/2018 | ............. | H02M 1/08 |

\* cited by examiner

PARASITIC IMMUNE ISOLATED DRIVE

TECHNICAL FIELD

The present disclosure relates to power circuit device drivers, and more particularly to parasitic immune isolated drive circuits for the excitation windings of generators.

BACKGROUND

Parasitic capacitance within the circuitry of a floating drive (e.g., the drive for the excitation winding of a synchronous generator, hereon referred to as an exciter driver), when operating as a switching converter will create parasitic currents. This is particularly when a switching converter uses relatively high voltages to drive inductive loads, as in the case of a generator excitation winding. During the high-to-low (or low-to-high) transitions of the power switches, the parasitic current tends to induce a voltage in the drive circuit that opposes the control action of the switches. This may result in slower transition, or even cause momentary oscillations during the on/off transitions. In the example of a typical exciter driver configuration, low-value resistors and capacitors may be used to minimize the voltage that may be induced by parasitic current.

However, the use of low-value resistors results in higher power dissipation during the normal operation of the switch driver. There remains a need in the art for a drive circuit that is immune to parasitic currents, that negates the need for low-value resistors. The result is a reduced power dissipation configuration. This disclosure provides a solution for this need.

SUMMARY

In accordance with at least one aspect of this disclosure, an isolated drive for a generator control unit, includes a gate driver configured to operatively connect to a switch to drive the switch between a first state and a second state, and a transformer configured to power the gate driver and provide an ON/OFF signal to the gate driver. An input line connects a first side of the transformer to the gate driver and a floating return line connects a second side of the transformer directly to a source terminal of the switch such that current flowing through the parasitic capacitance (e.g. across the transformer and/or drive circuit) bypasses the gate driver and flows to the floating return line.

In embodiments, there are no bridging diodes connecting between the input line and the floating return line between the transformer and the gate driver.

In certain embodiments, the floating return line can directly connect the second side of the transformer to the source terminal of the switch via a center tap of the transformer.

One or more electrical components can be operatively connected between the transformer and the switch configured to direct a flow of current from the transformer to the gate driver and the source terminal of the switch. The one or more electrical components can include a first capacitor operatively connected between the input line and the floating return line downstream of the transformer configured to charge with current from the transformer to maintain a voltage across an terminal input of the gate driver in the first state of the switch.

In embodiments, the one or more electrical components can include a resistor operatively connected between the input line and the floating return line downstream of the first capacitor configured to provide a limited flow of current between the transformer and the floating return line in the first state of the switch. A logic module can be operatively connected to the gate driver configured to provide a gate drive signal to the switch to drive the switch between the first and the second state. In embodiments, the logic module and the gate driver are immune to current flowing through parasitic capacitance of the transformer and/or drive circuit when the switch moves between states.

In certain embodiments, the one or more electrical components can include a second capacitor operatively connected between the input line and the floating return line, downstream of the logic module, configured to charge with current from the transformer in the first state of the switch and discharge current in the second state of the switch. The second capacitor can be configured to provide sufficient current to power the gate driver in the second state of the switch.

In embodiments, the one or more electrical components can include at least a first diode disposed in the input line, upstream of the first capacitor configured to control a flow of current in the input line between the transformer and the input terminal of the gate driver. The one or more electrical components can include a second diode in the input line disposed between the gate driver and the second capacitor configured to control a flow of current in the input line between the transformer and the power source terminal of the gate driver. In embodiments, the one or more electrical components of the isolated drive are galvanically isolated.

In certain embodiments, the isolated drive can form a portion of a generator controller and the generator controller can be configured to provide current from a power source to a generator exciter winding via the switch. The isolated drive can form a portion of a generator controller and the generator controller can be configured to provide an exciter winding current from a power source to a load via the switch. In embodiments, the power source can include a generator (e.g., a permanent magnet generator or PMG), where the generator can be operatively connected to the transformer configured to supply current to the transformer.

In accordance with at least one aspect of this disclosure, a method can include connecting a transformer directly to a source terminal of a switch to provide a direct path for transient current to flow through parasitic capacitance from the transformer and/or a connected circuit such that transient current bypasses a gate driver, and only supplies current from the transformer to the gate driver to power the gate driver to control a state of the switch. The method can further include, controlling the state of the switch to provide current to a generator exciter winding without interference due to the parasitic capacitance of the transformer and/or drive circuit.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
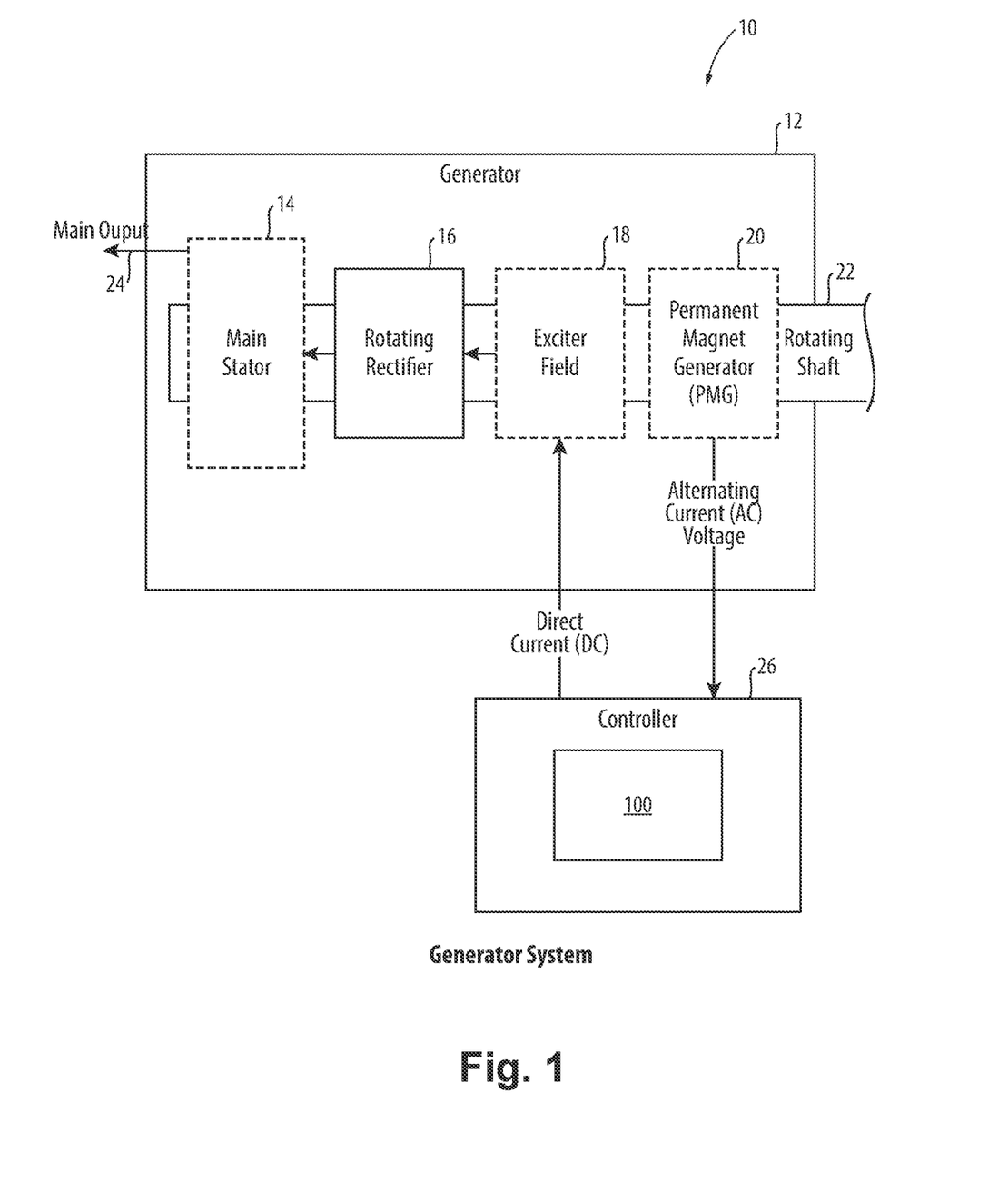
FIG. 1 is a generator system in accordance with at least one aspect of this disclosure, showing a generator and a generator controller.
Figure 3:
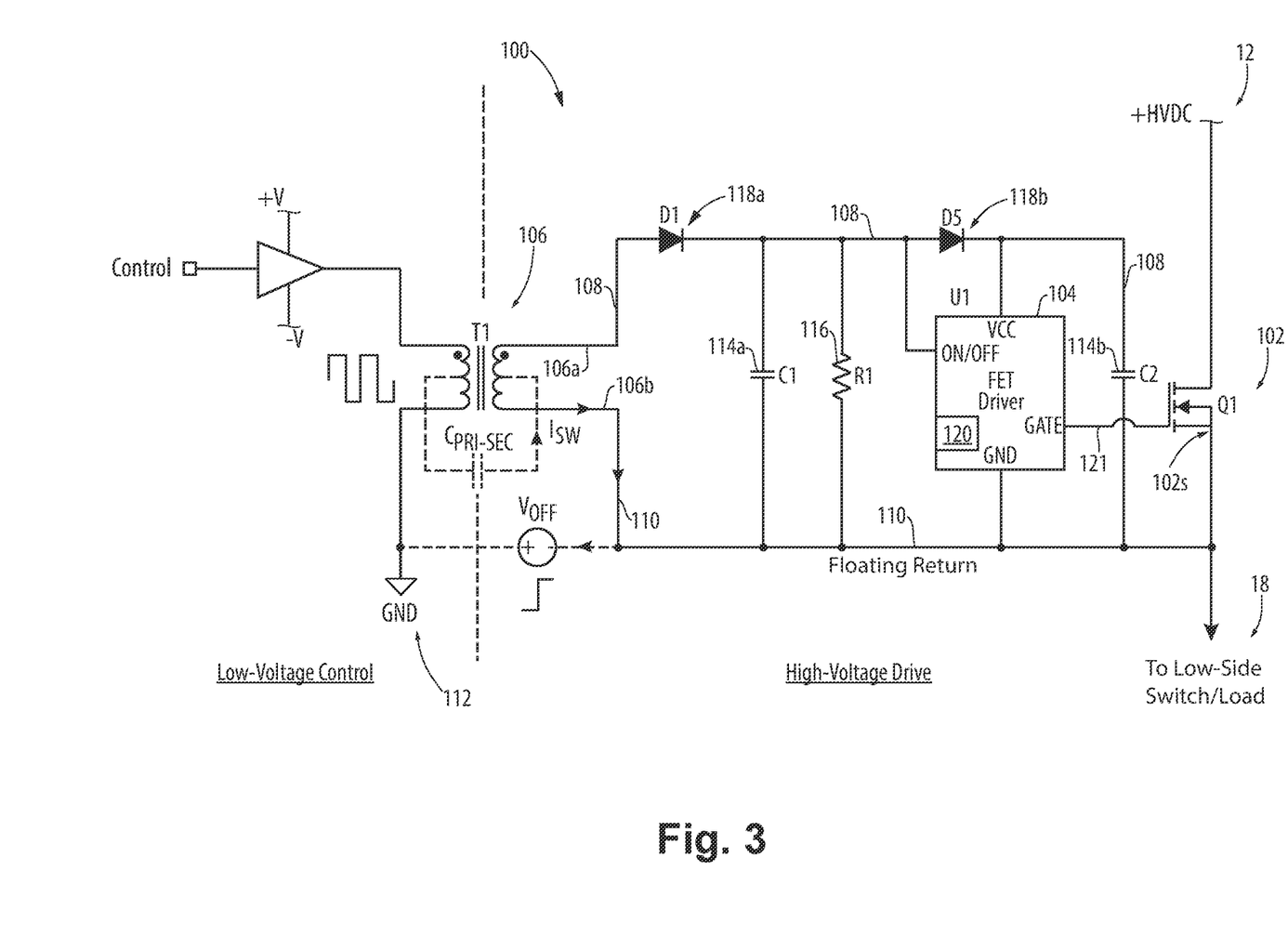
FIG. 3 is a schematic circuit diagram in accordance with this disclosure, showing an embodiment of the isolated drive of FIG. 2.
Figure 4:
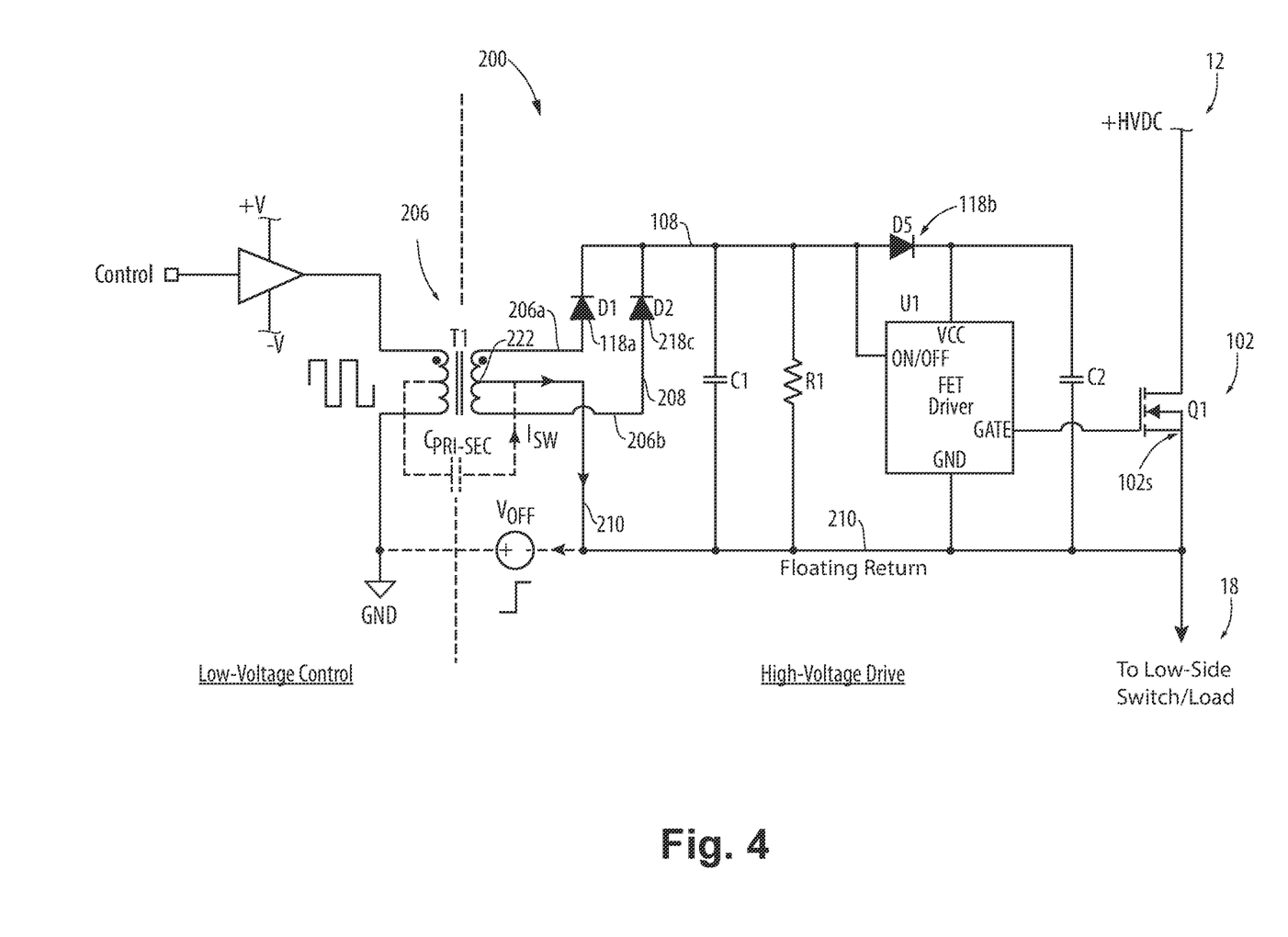
FIG. 4 is a schematic circuit diagram in accordance with this disclosure, showing another embodiment of the isolated drive of FIG. 2.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2-4.

As shown in FIG. 1, a generator system 10 can include a generator 12. The generator 12 includes a main stator 14, a rotating rectifier 16, an exciter field 18 (e.g., including exciter windings), a permanent magnet generator (PMG) 20 each of which is operatively positioned along a shaft 22 to provide a main output 24. The generator 12 is a device that converts mechanical energy from the shaft 22 to electrical energy. An example of the generator 12 can include a 3-Phase generator.

A generator controller 26 can be a programmable electronic device that manages the operations of the generator 12. In this regard, the controller 26 can rectify an alternating current (AC) voltage (e.g., generates/creates a direct current (DC) voltage that is proportional to a speed of the generator 12) and can provide a DC current to the generator 12, e.g. to exciter windings of the generator, based on this rectified AC voltage.

Figure 2:
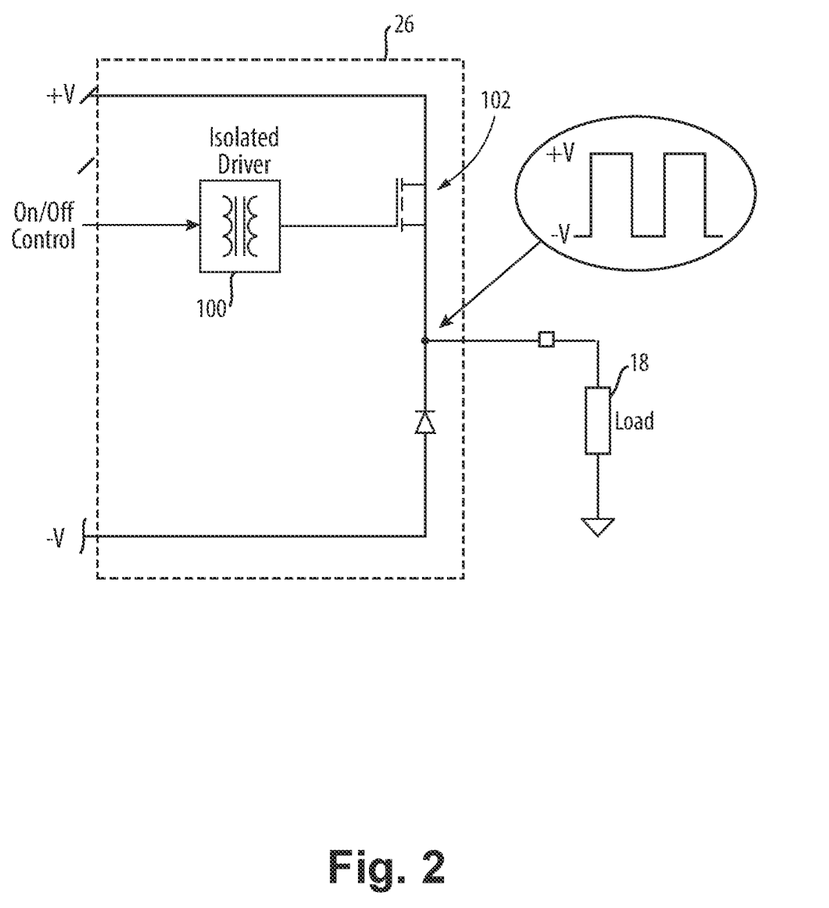
FIG. 2 is a schematic circuit diagram of a portion of the generator system of FIG. 1; showing an isolated drive.

Turning now to FIG. 2, the controller can include an isolated drive 100, configured to operatively connect between the generator PMG 20 and the exciter windings 18, via a switch 102. The isolated drive 100 can be operable to control the switch 102 to supply the power from the generator controller 26 to the exciter windings 18 through the switch 102. In embodiments the switch 102 can include a transistor, such as an IGBT, FET or a MOSFET (e.g., as shown).

In embodiments, such as shown in FIG. 3, the isolated drive 100 can include a gate driver 104 configured to operatively connect to the switch 102 to drive the switch 102 between a first state and a second state. A transformer 106 can be included and configured to power the gate driver 104 and provide an ON/OFF signal to the gate driver 104. The ON/OFF signal provided to the gate driver 104 can correlate to the first and second states of the switch 102, for example, when the gate driver 104 receives the ON signal, the gate driver 104 can drive the switch 102 to the first state, which can be an ON state, allowing power to flow from the PMG 20 to the load 18 (e.g., the exciter field windings), or to a low side switch if the switch 102 is a high side switch. Similarly, when the gate driver 104 receives the OFF signal, the gate driver 104 can drive the switch 102 to the second state, which can be an OFF state, preventing power from flowing from the PMG 20 to the load 18.

An input line 108 can connect a first side 106a of the transformer 106 directly to the gate driver 104 that controls switch 102, and a return line 110 can connect a second side 106b of the transformer 106 to the return terminal of the switch 102 and gate driver 104. In embodiments, as shown, the floating return line can provide a direct connection between the second side 106b of the transformer 106 and the source terminal 102S of the switch 102. In embodiments the return line 110 can be a floating return line. This connection made by return line 110 allows a pathway for transient current to flow through the parasitic capacitance (e.g., noted as $C_{PRI\_SEC}$) from the transformer 106 and/or drive circuit to bypass the gate driver 104 and flow directly to floating return line 110. This connection prevents any oscillations in the gate driver 104 ON/OFF signal, or any latent currents in the transformer 106 from passing through the input line 108 and reaching the gate driver 104.

In certain embodiments (e.g., as shown), the isolated drive 100 may not include any bridging diodes connecting between the input line 108 and the return line 110 between the transformer 106 and the gate driver 104. For example, in conventional systems, bridging diodes may have been included to rectify the incoming current from the transformer 106, however, these rectifying diodes may have prevented the flow of current through any parasitic capacitance from the transformer 106 and/or drive circuit from reaching the floating return 110 prior to flowing through the input line 108 to the gate driver 104. By removing these diodes, the parasitic capacitance current can follow the path of least resistance directly from the transformer 106 to the floating return 110, without affecting the downstream components, such as the gate driver 104 and switch 102 itself.

As shown, one or more electrical components can be operatively connected between the transformer 106 and the switch 102 configured to direct a flow of current from the transformer 106 to the gate driver 104 and the source terminal of the switch 102S. In certain embodiments, the one or more electrical components can include any one or more of a capacitor 114, a resistor 116, and/or a diode 118. For example, the one or more electrical components can include a first capacitor 114a operatively connected between the input line 108 and the floating return line 110 downstream of the transformer 106 configured to store current from the transformer 106 to maintain a voltage across the ON/OFF input of FET driver 104 in the first state of the switch 102.

In embodiments, the one or more electrical components can include a resistor 116 operatively connected between the input line 108 and the return line 110 downstream of the first capacitor 114a configured to allow for a limited flow of current between the transformer 106 and the floating return line 110 in the first state of the switch 102. A first diode 118a can be disposed in the input line 108, upstream of the first capacitor 114a configured to control a flow of current in the input line 108 between the transformer 106 and the ON/OFF terminal of the gate driver 104. A second diode 118b can be disposed in the input line 108 disposed between the ON/OFF terminal of the gate driver 104 and a second capacitor 114b configured to control a flow of current in the input line 108 between the transformer 106 and the voltage source terminal of the gate driver 104.

In embodiments, a logic module 120 can be operatively connected to (or included within) the gate driver 104 configured to provide a gate drive signal 121 to the switch 102 to drive the switch 102 between the first and the second state. As provided herein, the direct connection provided between the transformer 106 and the source terminal of the switch 102S and the direct path to floating return 110 allows the logic module 120 and the gate driver 104 to be immune to transient current flowing through parasitic capacitance in the entire circuit.

In embodiments, the second capacitor 114b can be operatively connected between the input line 108 and the floating return line 110, downstream of the logic module 120, configured to charge with current from the transformer 106 in the first state of the switch 102 (e.g., during the on period). In certain embodiments, the second capacitor 114b can be sized and configured to provide sufficient current to power the gate driver 104 and logic module 120 in the second state of the switch (e.g., during the off period).

As described with reference to FIG. 1, the controller 26 can be configured in a generator 12 to provide excitation current from a power source 20 to the excitation winding 18 via the switch 102. The voltage source can be the PMG 20 where it is operatively connected to the transformer 106 configured to supply the current to the transformer 106. In embodiments, the isolated drive 100 itself and the one or more electrical components 114, 116, 118 included therein can be galvanically isolated.

In certain embodiments, such as shown in FIG. 4, an isolated drive 200 can be similar to that of isolated drive 100, for example drive 200 can have similar components and features with respect to drive 100. For brevity, the description of common elements that have been described above for drive 100 are not repeated with respect to drive 200 as shown in FIG. 4. In drive 200, the floating return line 210 can directly connect the transformer 206 to the source terminal of the switch 102S via a center tap 222 of the transformer 206. The second side 206b of the transformer can be connected to the input line 108, and a third diode can be disposed in the input line 208 between the second side 206b of the transformer 206 and the input line 108.

In accordance with at least one aspect of this disclosure, a method can include, connecting a transformer (e.g., transformer 106) directly to a source terminal of a switch 102S to provide a direct path for parasitic capacitance current from the transformer and/or drive circuit such that the parasitic current bypasses a gate driver (e.g., gate driver 104). The method can include supplying current from the transformer to the gate driver to power the gate driver to control a state of the switch. The method can also include controlling the state of the switch to provide power to a load (e.g., exciter winding 18) without interference from parasitic capacitance from the transformer and/or drive circuit. By making the switch immune to such parasitic capacitance, the circuit as a whole can achieve lower power dissipation, improved efficiency.

Embodiments related to floating drivers using transistors, for example, N-channel FETs, a floating control circuit referenced to the FET source, and a transformer used to provide isolation while allowing power and control signals to the floating control circuit. In embodiments, the floating control circuit can include a generator control unit exciter driver, or another power driver. In certain instances, parasitic capacitance can be felt within the circuitry every time the FET is switched on or off. In a traditional exciter driver configuration, lower-value resistors and capacitors are used to attempt to prevent parasitic currents from turning the driver on. However, this method may not always be reliable and can lead to large amounts of dissipation, rendering the circuit inefficient. Embodiments however, by connecting the source terminal of the transistor directly to the transformer secondary, parasitic currents bypass the control circuit entirely, making the circuit immune to parasitic effects on both a high and low side, as well as eliminating the need for additional resistors and capacitors, to greatly increase the overall efficiency of the system.

As will be appreciated by those skilled in the art, aspects of the present disclosure may be embodied as a system, method or computer program product. Accordingly, aspects of this disclosure may take the form of an entirely hardware embodiment or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. An isolated drive for a generator control unit, comprising:
   a gate driver configured to operatively connect to a switch to drive the switch between a first state and a second state;
   a transformer configured to power the gate driver and provide an ON/OFF signal to the gate driver;
   an input line configured to connect a first side of the transformer to the gate driver;
   a floating return line configured to connect a second side of the transformer directly to a source terminal of the switch such that current flowing through a parasitic capacitance across the transformer and/or a drive circuit bypasses the gate driver and flows to the floating return line; and
   one or more electrical components operatively connected between the transformer and the switch, wherein the one or more electrical components include:
      at least a first diode disposed in the input line, upstream of a first capacitor configured to control a flow of current in the input line between the transformer and an input terminal of the gate driver;
      a second capacitor operatively connected between the input line and the floating return line, downstream of a logic module, configured to charge with current from the transformer in the first state of the switch and discharge current in the second state of the switch; and
      a second diode in the input line disposed between the gate driver and the second capacitor configured to control a flow of current in the input line between the transformer and the source terminal of the gate driver.

2. The isolated drive of claim 1, wherein there are no bridging diodes connecting between the input line and the floating return line between the transformer and the gate driver.

3. The isolated drive of claim 1, wherein the floating return line is configured to directly connect the second side of the transformer to the source terminal of the switch via a center tap of the transformer.

4. The isolated drive of claim 1, wherein the one or more electrical components are configured to direct a flow of current from the transformer to the gate driver and the source terminal of the switch.

5. The isolated drive of claim 4, wherein the one or more electrical components include the first capacitor operatively connected between the input line and the floating return line downstream of the transformer configured to charge with current from the transformer to maintain a voltage across the input terminal of the gate driver in the first state of the switch.

6. The isolated drive of claim 5, wherein the one or more electrical components include a resistor operatively connected between the input line and the floating return line downstream of the first capacitor configured to provide for limited flow of current between the transformer and the floating return line in the first state of the switch.

7. The isolated drive of claim 6, further comprising the logic module operatively connected to the gate driver configured to provide a gate drive signal to the switch to drive the switch between the first state and the second state.

8. The isolated drive of claim 7, wherein the logic module and the gate driver are immune to the current flowing through the parasitic capacitance of the transformer and/or the drive circuit when the switch moves between states.

9. The isolated drive as recited in claim 1, wherein the second capacitor is configured to provide enough current to power the gate driver in the second state of the switch.

10. The isolated drive of claim 1, wherein the isolated drive is included in a generator controller, wherein the generator controller is configured to provide current from a power source to a generator exciter winding via the switch.

11. The isolated drive of claim 10, wherein the power source includes a generator, wherein the generator is operatively connected to the transformer configured to supply current to the transformer.

12. The isolated drive of claim 1, wherein the one or more electrical components of the isolated drive are galvanically isolated.

13. An isolated drive for a generator control unit, comprising:
   a gate driver configured to operatively connect to a switch to drive the switch between a first state and a second state;
   a transformer configured to power the gate driver and provide an ON/OFF signal to the gate driver;
   an input line configured to connect a first side of the transformer to the gate driver;
   a floating return line configured to connect a second side of the transformer directly to a source terminal of the switch such that current flowing through a parasitic capacitance across the transformer and/or a drive circuit bypasses the gate driver and flows to the floating return line, wherein there are no bridging diodes connecting between the input line and the floating return line between the transformer and the gate driver;
   a logic module operatively connected to the gate driver configured to provide a gate drive signal to the switch to drive the switch between the first and the second state; and
   one or more electrical components operatively connected between the transformer and the switch, wherein the one or more electrical components include:
      at least a first diode disposed in the input line, upstream of a first capacitor configured to control a flow of current in the input line between the transformer and an input terminal of the gate driver;
      a second capacitor operatively connected between the input line and the floating return line, downstream of the logic module, configured to charge with current from the transformer in the first state of the switch and discharge current in the second state of the switch; and a second diode in the input line disposed between the gate driver and the second capacitor configured to control a flow of current in the input line between the transformer and the source terminal of the gate driver.

14. An isolated drive for a generator control unit, comprising:

a gate driver configured to operatively connect to a switch to drive the switch between a first state and a second state;

a transformer configured to power the gate driver and provide an ON/OFF signal to the gate driver;

an input line configured to connect a first side of the transformer to the gate driver;

a floating return line configured to connect a second side of the transformer directly to a source terminal of the switch such that current flowing through a parasitic capacitance across the transformer and/or drive circuit bypasses the gate driver and flows to the floating return line;

a logic module operatively connected to the gate driver configured to provide a gate drive signal to the switch to drive the switch between the first and the second state, wherein the logic module and the gate driver are immune to current flowing through the parasitic capacitance of the transformer and/or the drive circuit when the switch moves between states; and one or more electrical components operatively connected between the transformer and the switch configured to direct a flow of current from the transformer to the gate driver and the source terminal of the switch, wherein the one or more electrical components includes:

a first capacitor operatively connected between the input line and the floating return line downstream of the transformer configured to charge with current from the transformer to maintain a voltage across an input terminal of the gate driver in the first state of the switch;

a resistor operatively connected between the input line and the floating return line downstream of the first capacitor configured to provide for limited flow of current between the transformer and the floating return line in the first state of the switch; a second capacitor operatively connected between the input line and the floating return line, downstream of the logic module, configured to charge with current from the transformer in the first state of the switch and discharge current in the second state of the switch, wherein the second capacitor is configured to provide enough current to power the gate driver in the second state of the switch;

at least a first diode disposed in the input line, upstream of the first capacitor configured to control a flow of current in the input line between the transformer and the input terminal of the gate driver; and a second diode in the input line disposed between the gate driver and the second capacitor configured to control a flow of current in the input line between the transformer and the source terminal of the gate driver.

15. The isolated drive of claim 14, wherein the isolated drive is included in a generator controller, wherein the generator controller is configured to provide current from a power source to a generator exciter winding via the switch.

16. The isolated drive of claim 15, wherein the power source includes a generator, wherein the generator is operatively connected to the transformer configured to supply current to the transformer.

\* \* \* \* \*